United States Patent [19]

Yu

[11] Patent Number: 5,859,455

[45] Date of Patent: Jan. 12, 1999

[54] NON-VOLATILE SEMICONDUCTOR MEMORY CELL WITH CONTROL GATE AND FLOATING GATE AND SELECT GATE LOCATED ABOVE THE CHANNEL

[76] Inventor: Shih-Chiang Yu, 10451 Davison Ave., Cupertin, Calif. 95014

[21] Appl. No.: 999,609

[22] Filed: Dec. 31, 1992

[51] Int. Cl.⁶ .................................................. H01L 29/788
[52] U.S. Cl. ........................... 257/321; 257/315; 257/306
[58] Field of Search .................................. 257/315, 316, 257/317, 318, 321; 365/185

[56] References Cited

U.S. PATENT DOCUMENTS

| | | | |
|---|---|---|---|
| 4,114,255 | 9/1978 | Sababury et al. | 29/571 |
| 4,929,988 | 5/1990 | Yoshikawa | 357/23.5 |
| 5,041,886 | 8/1991 | Lee | 357/23.5 |
| 5,065,201 | 11/1991 | Yamauchi | 357/23.5 |
| 5,089,866 | 2/1992 | Iwasa | 357/23.5 |
| 5,095,345 | 3/1992 | Gill | 357/23.5 |
| 5,101,250 | 3/1992 | Arima et al. | 365/185 |
| 5,111,427 | 5/1992 | Kobayashi | 365/49 |
| 5,111,430 | 5/1992 | Morie | 365/185 |
| 5,117,392 | 5/1992 | Harada | 365/189.09 |
| 5,119,330 | 6/1992 | Tanagawa | 365/168 |
| 5,153,691 | 10/1992 | Guterman | 257/321 |
| 5,280,446 | 1/1994 | Ma et al. | 365/185 |

FOREIGN PATENT DOCUMENTS

| | | | |
|---|---|---|---|
| 54-111785 | 9/1979 | Japan | 257/316 |
| 61-144878 | 7/1986 | Japan | 257/316 |
| 61-216482 | 9/1986 | Japan | 257/316 |

*Primary Examiner*—Carl W. Whitehead
*Assistant Examiner*—Alice W. Tang
*Attorney, Agent, or Firm*—Kam T. Tam

[57] ABSTRACT

A non-volatile semiconductor memory cell includes a semiconductor substrate with a source and a drain formed therein. A channel is defined between the source and the drain. Atop the channel is a floating gate which is controlled by the X-control line and the Y-control line. The floating gate is uniquely disposed in the semiconductor substrate relative to the control lines such that when it is not addressed, the memory cell is isolated from the rest of the memory cells. As a consequence, the normal programming, deprogramming, and reading operations with other cells are not interfered. Moreover, the unique structure also facilitates the addressing of each of the memory cell.

14 Claims, 8 Drawing Sheets

|  | BL | SGL | SL | VT |
|---|---|---|---|---|
| PROGRAMMING | +5V | +12V | 0V | 9V |
| DEPROGRAMMING | 0V | −12V | +5V | 3V |

| | DL | XCG | YCG | SL | VT |
|---|---|---|---|---|---|
| PROGRAMMING | +5V | +12V | +2V | 0V | +6V |
| DEPROGRAMMING | FLOAT | −12V | −12V | +5V | −2V |
| READING | +1V | +3V | +3V | 0V | |

NON-VOLATILE SEMICONDUCTOR MEMORY CELL WITH CONTROL GATE AND FLOATING GATE AND SELECT GATE LOCATED ABOVE THE CHANNEL

BACKGROUND OF THE INVENTION

1. Field of the Invention

The present invention relates to semiconductor memories, in particular, to non-volatile semiconductor memories such as Erasable Programmable Read Only Memory (EPROM), or Electrically Erasable and Programmable Read Only Memory (EEPROM).

2. Description of the Related Art

Metal Oxide Semiconductor (MOS) semiconductor memory devices, specifically, floating gate MOS transistor structures used as memory cells, are well known in the art. Each of these devices is operated by charging or discharging a floating gate. The charged floating gate affects the underlying channel which in turn determined the conductivity between the drain to the source. In EPROM technology, the floating gate is charged by hot-electron injection from the channel and discharged by ultra-violet light illumination. In EEPROM technology, the floating gate is both charged or discharged by the Fowler-Nordheim (F-N) tunneling effect. Recently, there is a new generation of devices called the flash EEPROM which utilizes the hot-electron injection from the channel for the charging of the floating gate, and the Fowler-Nordheim tunneling effect for the discharging of the floating gate.

FIG. 1a shows a top plan view of a conventional floating gate MOS cell which is denoted by reference numeral 12. FIG. 1b shows a cross-sectional view taken along line 1b–1b of FIG. 1a. FIG. 1c shows another cross-sectional view taken along line 1c—1c of FIG. 1a. The cell of FIGS. 1a–1c includes a P-type silicon substrate 1 having an N+-type diffusion drain 2 and source 3 formed in the substrate. Between drain 2 and source 3 is a channel region 4. A floating gate 6 is dielectrically disposed atop insulating layer 5 and extends over to the field oxide 9. A select gate 8 formed on an insulating layer 7 on the top of floating gate 6 and crosses over field oxide 9. A contact 10 formed atop the drain 2 provides connection to a metal bit line 11.

FIG. 2 is a schematic diagram of an equivalent circuit of the memory cell shown in FIGS. 1a–1c. In an memory cell array with the aforementioned cell construction, the N+-type source 3 is connected to a source line SL, while the N+-type drain 2 is connected to a bit line BL. Moreover, the select gate 8 is connected to a select gate line SGL. When such a cell is used as a flash EEPROM device, insulating layer 5 is intentionally designed with a thin geometry, for example, 11 nanometers. An illustration of such a design can be found in A. Umezawa et al., *IEEE Journal of Solid State Circuits (JSSC)*, vol. 27, No. 11, November 1991, PP1540–1546; or in T. Jinbo et al., *IEEE JSSC*, vol. 27, No. 11, November 1992, PP1547–1553. FIG.3 shows a set of exemplary voltage values at various terminals for the programming and deprogramming of the cell, along with the corresponding change in threshold voltages VT of the MOS transistor 12. The main disadvantage of this type of memory cell is that it is space consuming. As a consequence, number of cells integrated per unit area in the semiconductor substrate is relatively low. Moreover, during the deprogramming process, threshold voltage VT of the cell needs to be constantly checked and deprogrammed for an assurance that the threshold voltage VT of transistor 12 falls within a predetermined window. In this particular case, the predetermined window is from +1 Volt to +3 Volts. Phrased differently, threshold voltage VT of transistor 12 can not assume a negative value. The main reason is that if the threshold voltage VT of transistor 12 falls below zero volt, transistor 12 is at "ON" state with a conductive channel 4, resulting in bit line BL and source line SL being electrically shorted together. The consequence is twofold. First, floating gate MOS transistor 12 are normally arranged in a matrix format with bit line BL in each of the matrix columns connected together, and with the select gate line SGL of each of the matrix rows connected together. Source line SL of all the transistors are shorted together to ground potential. A conductive transistor 12 in any of the column will yield a false read operation in the particular column. In addition, a shorted channel 4 in transistor 12 effectively clamps the bit line BL to the ground potential. Thus any transistor 12 in the same column can not be programmed as it needs a +5 Volts on bit line BL as one of the conditions for programming as shown in FIG. 3.

Thus, the requirement imposed on prior art transistor 12 that it must fall with a predetermined threshold voltage window after deprogramming places further complication in design with extra circuitries.

In view of the drawbacks with the aforementioned memory cells, there are EPROM and EEPROM cells designed in the past with better performances. These cells are fabricated with thin field oxide regions and contacts. Examples of such cells are taught in R. Kazerounim et al., *IEDM Technical Digest* 1991, paper 11.5.1, pp 311–314; in B. J. Woo et al., *IEDM Technical Digest* 1990, paper 5.1.1, pp 91–94; in Y. Yamauchi et al., *IEDM Technical Digest* 1991, pp 319–322; or in Gill, U.S. Pat. No. 5,051,796, issued Sep. 24, 1991. These cells offer various improvements over the earlier structures. However, to attain a high gate capacitance coupling ratio, which is defined as the ratio of the coupled floating gate voltage to the active control gate voltage, the area of the main cell needs to be built with a large geometry. consequently, a large device consumes more space in a semiconductor substrate and increases the susceptibleness to noise. The reduction in noise immunity vulnerably exposes the memory cell to spurious signals which occur frequently during the programming process.

SUMMARY OF THE INVENTION

It is accordingly an object of the present invention to provide a non-volatile semiconductor memory device that is reliable, more immune to noise during programming, has a small geometrical size and a high gate capacitance coupling ratio, and does not place limitation on the threshold voltage that must be kept to a positive value after the deprogramming step.

These and other objects of the present invention are accomplished with an improved cell structure of a non-volatile semiconductor memory cell.

In the preferred embodiment of the present invention, there is provided a non-volatile semiconductor memory device having a semiconductor substrate of a first conductivity type. A source and a drain of a second conductivity type are formed in the semiconductor substrate. The source and the drain define a channel therebetween. There is a first insulation film formed on the semiconductor substrate covering the channel, the drain, and the source. A Y-control trace is disposed on the first insulation film and overlies a portion of the channel and a portion of the source. A floating gate is dielectrically formed on the insulating film covering the Y-control trace. Furthermore, one segment of the floating gate dielectrically overlies a portion of the source and another segment of the floating gate dielectrically overlies another portion of the channel. A X-control trace is also disposed on the insulation film and dielectrically overlying the floating gate. The X-control trace also covers a portion of the channel region, and further dielectrically overlies the source and the drain. Isolations are formed between the source and the drain not covered by X-control trace or the Y-control trace. The isolations can be ion implants, thick oxides or oxide-filled trenches.

Additional objects and features of the present invention will become more apparent in the following description.

DESCRIPTION OF THE DRAWINGS

FIG. 1b is a cross-sectional view taken along line 1b—1b of FIG. 1a.

FIG. 1c is a cross-sectional view taken along line 1c—1c of FIG. 1a.

FIG. 2 is a schematic diagram illustrating an equivalent circuit of the memory cell shown in FIG. 1a.

FIG. 3 is a table showing the voltage values required for the programming and deprogramming of the memory cell of FIG. 1a.

FIG. 4b is a cross-sectional view the memory cell taken along line 4b—4b of FIG. 4a.

FIG. 4c is a cross-sectional view of the memory cell taken along line 4c—4c of FIG. 4a.

FIG. 7b is a cross-sectional view of the array taken along line 7b—7b of FIG. 7a.

FIG. 7c is a schematic diagram illustrating the equivalent circuit of FIG. 7a.

FIG. 10b is a cross-sectional view taken along line 10b—10b of FIG. 10a.

DETAILED DESCRIPTION OF THE INVENTION

Figure 1A:
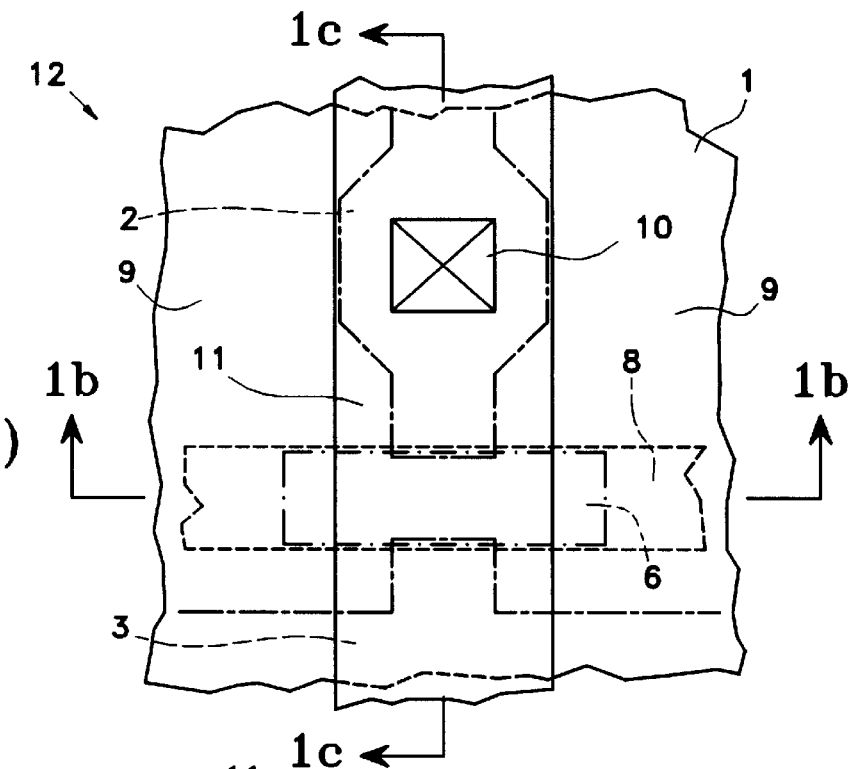
FIG. 1a is a top plan view of a prior art non-volatile semiconductor memory cell.
Figure 1B:
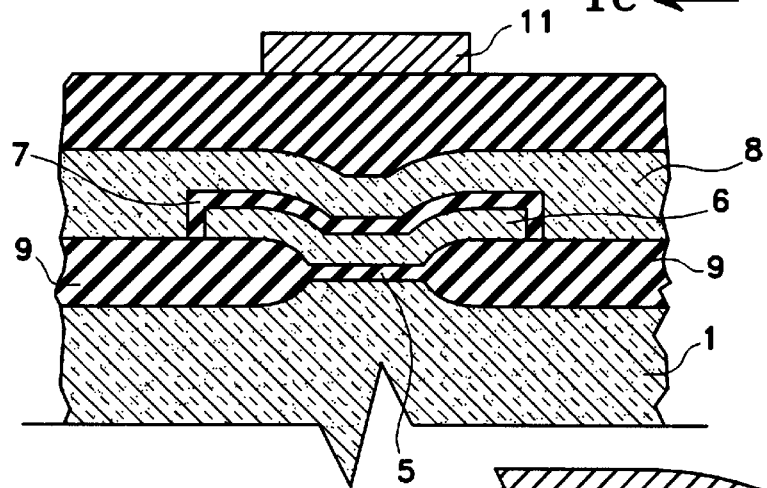
Figure 1C:
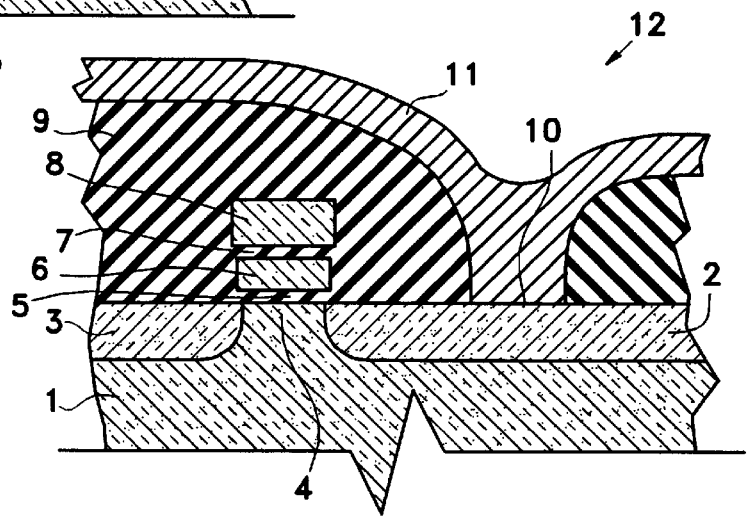
Figures 2, 3:
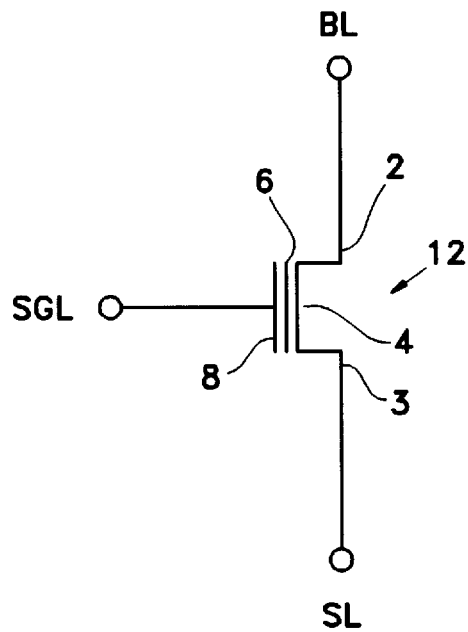
Figure 4A:
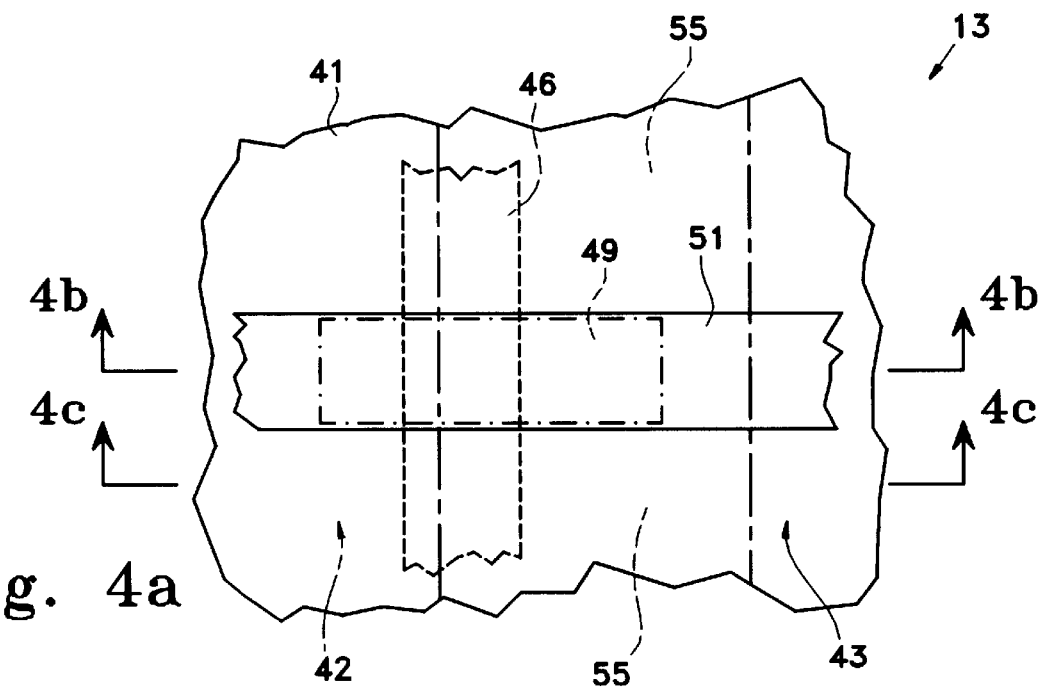
FIG. 4a is a top plan view of the non-volatile semiconductor memory cell in accordance with the preferred embodiment of the present invention.
Figure 4B:
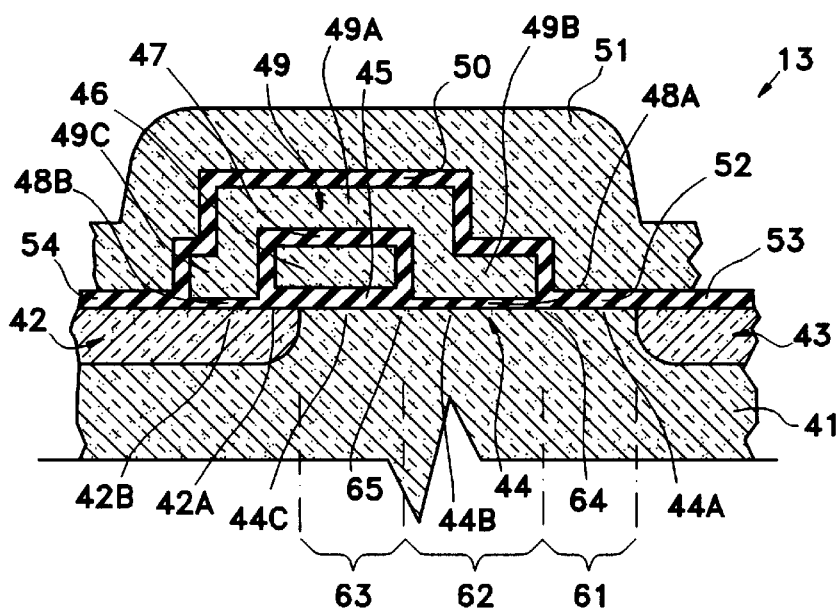
Figure 4C:
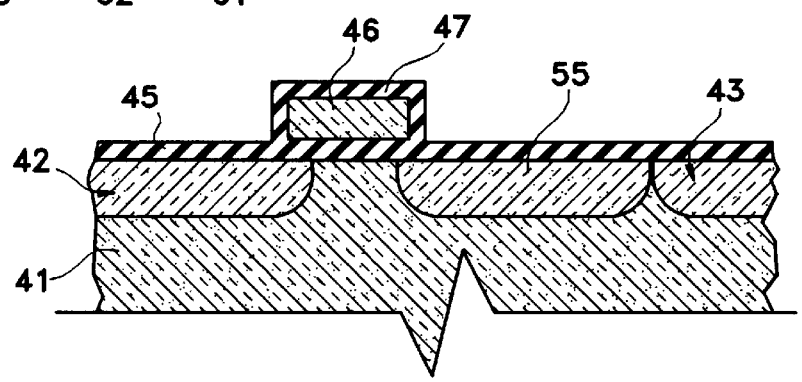

A preferred embodiment according to the present invention described with reference to the accompanying drawings. FIG. 4a is a top plan view of the memory cell of the present invention generally identified by reference numeral 13. FIGS. 4b and FIG. 4c are cross-sectional views taken along line 4b—4b and line 4c—4c of FIG. 4a, respectively.

In this embodiment, formed in a P-type semiconductor substrate 41, for example, are $N^+$-type source 42 and drain 43. Source 42 and drain 43 are formed in the semiconductor substrate 41 at a spaced apart relationship. A channel 44 is also formed between the source 42 and the drain 43. Functionally, channel 44 is divided into three portions, namely, first portion 44A, second portion 44B, and third portion 44C. Moreover, for the sake of illustration, source 42 is divided into first portion 42A and second portion 42B. There is a first control trace, called the Y-control trace 46 in this case, dielectrically disposed atop third portion 44C of the channel 44 and the first portion 42A of $N^+$-type source 42. Y-control trace 46 insulated from channel 44 and source 42 by an insulation film 45. There is also a floating gate 49 which includes a first segment 49A, a second segment 49B, and a third segment 49C. The first segment 49A of floating gate 49 dielectrically overlies the Y-control trace 46, while the second segment 49B of floating gate 49 dielectrically overlies the second portion 44B of channel 44. Moreover, the third segment 49C of floating gate 49 extends beyond Y-control trace 46 and dielectrically overlies the second portion 42B of source 42. Floating gate 49 insulates from Y-control trace 46, channel 44, and source 42 by insulating film 47, thin tunnel film 48A and thin tunnel film 48B, respectively. A second control trace, called the X-control trace 51 in this case, is dielectrically disposed atop floating gate 49 separated by insulating film 50. X-control trace 51 also dielectrically overlies the rest of the channel 44, insulated by insulating film 52. Isolations between drain 43 and source 42 in substrate 41 are accomplished by $P^+$-type diffusion 55 (FIG. 4c).

Figures 5, 6:
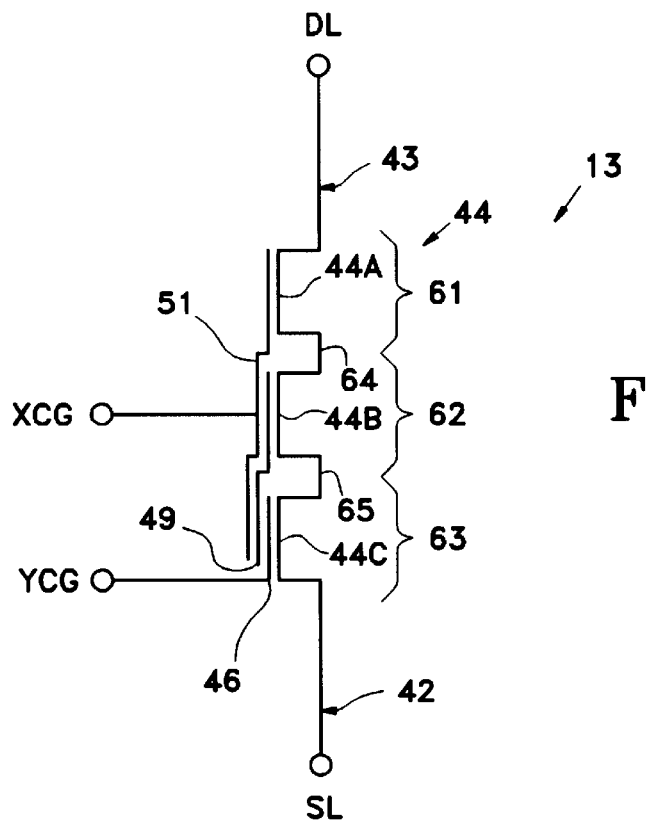
FIG. 5 is a schematic diagram illustrating an equivalent circuit of the memory cell in accordance with the preferred embodiment of the present invention.
FIG. 6 is a table showing the potential voltage values required for the programming, deprogramming, and reading of the memory cell of FIG. 5.

To form a memory cell array, source 42 and drain 43 are electrically tied to source line SL and drain line DL, respectively. Y-control trace 46 and X-control trace 51 are also electrically connected together to form Y-control trace line YCG and X-control trace line XCG, respectively. The arrangement is clearly shown in FIG. 5 which is a schematic representation of the structure shown in FIGS. 4a–4c. In FIG. 5, the cell is functionally partitioned into three transistors 61, 62 and 63. The corresponding partitions are also shown in FIG. 4b physically identified with parentheses. As shown in FIGS. 4a—4c and 5, transistor 61 is controlled by X-control trace 51 alone, while transistor 62 is controlled by floating gate 49, and transistor 63 is controlled by Y-control trace 46. For the sake of illustration, two nodes identified by reference numerals 64 and 65 are identified in FIGS. 4b and 5. The roles of nodes 64 and 65 will be explained later in this specification.

The memory cells 13 is capable of three operations, namely, programming, deprogramming, and reading. FIG. 6 is a table of potential voltage values applied to the drain line DL, X-control trace line XCG, Y-control trace line YCG and source line SL under the three operational conditions. The resultant cell threshold voltage VT is also shown.

During programming, applied voltages of +5 V, +12 V, +2 V and OV are applied to the drain line DL, X-control trace line XCG, Y-control trace line YCG, and source line SL, respectively. With positive voltages on both control traces 46 and 51, the floating gate is capacitively coupled with a potential with a voltage level which is determined by the coupling efficiency on both the X-control trace 51 and Y-control trace 46. Moreover, with both control traces 46 and 51 energized to positive voltages, transistors 61, 62 and 63 are all turned on. With transistors 61 and 62 turned on, the channel portions 44A and 44B of channel 44 are conductive. Voltage adjacent to node 65 approximately equals the voltage at drain line DL, which is at +5 V. Similarly, with transistor 63 on, the channel 44C of transistor 63 is conductive. Voltage adjacent to node 65 also approximately equals the voltage at source line SL, which is at 0 V. As a consequence, there is a steep potential gradient developed at a tightly confined area in the vicinity of node 65. As a result, current flows in the direction of the steep potential gradient. As was mentioned earlier, floating gate 49 is capacitively coupled with a positive voltage. Traveling electrons in the proximity of node 65 residing in channel 44 flowing in a direction from the source line SL to the drain line DL (opposite to the direction of current flow) can tunnel through thin gate oxide 48A into floating gate 49 (FIG. 4b). This mechanism is called Source Side Injection (SSI). It here should be noted that the tunneling of electrons via the SSI effect is different as compared to Fowler-Nordheim tunneling effect. Tunneling of electrons under the Fowler-Nordheim tunneling effect does not involve electrons travelling in the direction from the source to the drain. Programming floating gate 49 under the source side injection effect substantially curtails the programming time as the electrons are in more energized states. Attention is now directed back to FIGS. 4b and 5. Under the source side injection effect, electrons are couplingly induced in floating gate 49. After the X-control trace 51 and the Y-control trace 46 are de-energized, electrons are trapped inside floating gate 49. These trapped charges dielectrically repel the electrons in the underlying channel 44B of transistor 62, thereby inverting a P-type region in channel 44. Phrased differently, transistor 13 is induced with a threshold voltage of +6 Volts. The non-conductive channel can be used to represent the logic "0" in a digital system, for example. It here should also be emphasized that only the memory cell 13 under both the positively energized X-control trace 51 and the Y-control trace 46 can be programmed. Memory cells under either the positively energized X-control trace 51, or the positively energized Y-control trace 46, but not both, can not be programmed. The reason is when either one of the control traces 51 and 46 is not positively energized, either one of the transistor 61 and 63 is not turned on, and the SSI mechanism can not occur. This unique arrangement enable a plurality of memory cells to be arranged in a matrix format and substantially facilitating the process of addressing.

During de-programming, applied voltages of −12 V, −12 V, and +5 V are applied to the X-control trace line XCG, Y-control trace line YCG, and source line SL, respectively. The drain line DL is left floating electrically. With relative high negative voltages on both control traces 46 and 51, the floating gate 49 is capacitively coupled with a negative potential. The value of the negative potential coupled in floating gate 49 is determined by the coupling efficiency on both the X-control trace 51 and the Y-control trace 46. Floating gate 49 shares a large overlapped area with X-control trace 51, and with Y-control trace 46. The coupling efficiency can therefore be designed to assume a high value. As a consequence, floating gate 49 coupled with a higher voltage ensures a faster de-programming operation. The negative potential at floating gate 49 repels electrons to the underlying second portion 42B of source 42 through the thin tunnel oxide 48B. After the control traces 51 and 46 are de-energized, electrons are trapped outside of floating gate 49, leaving floating gate 49 positively charged. These trapped charged dielectrically attracts the electrons in the underlying channel 44B of transistor 62, thereby inducing a N-type region in channel 44B. Phrased differently, transistor 13 is deprogrammed with a threshold voltage of −2 Volts. The conductive channel can be used to represent the logic "1" in a digital system, for example. With drain line DL floating, no current flows in channel 44 of memory cell 13. The tunneling of electrons through the thin oxide 48B is under the Fowler-Nordheim tunneling effect. As is shown in this embodiment, the threshold voltage VT of the de-programmed memory cell 13 is at −2 Volts. The restriction that memory cell 13 must maintain a positive threshold voltage, as demanded by many prior art counterparts, is no longer imposed. The reason is due to the unique design of memory cell 13 in which transistors 61 and 63 are normally off during normal operations. With transistors 61 and 63 off, the voltage of the bit line will not be pulled down during the read operation, and the word line will not be clamped down during the programming or deprogramming operations with the other cells. Transistors are turned on only when the selected memory cell 13 are addressed. Again, it also needs to be emphasized that only the memory cell 13 under both the negatively energized X-control trace 51 and the Y-control trace 46 can be deprogrammed. Memory cells under either the negatively energized X-control trace 51, or the negatively energized Y-control trace 46, but not both, can not be de-programmed. The reason is when either one of the control traces 51 and 46 is not negatively energized, the coupled potential at floating gate 49 is not sufficiently high enough to cause the Fowler-Nordheim tunneling effect.

During the read operation, voltages of +1V, +3 V, +3 V and 0 V are applied at the drain line DL, X-control trace line XCG, Y-control trace line YCG, and source line SL, respectively. Suppose that memory cell 13 is programmed with a +6 V threshold voltage. The +3 V voltage at both the X-control trace line XCG, and Y-control trace line YCG is insufficient to turn transistor 62 on. As a consequence, the digital bit "0" is read, for example. In a similar manner, suppose that memory cell 13 is de-programmed with a −2 V threshold voltage. With the voltages at X-control trace line XCG and Y-control trace line at 3 Volts, transistors 61, 62 and 63 are all turned on. Consequently, the digital bit "1" is read, for example.

Figure 7A:
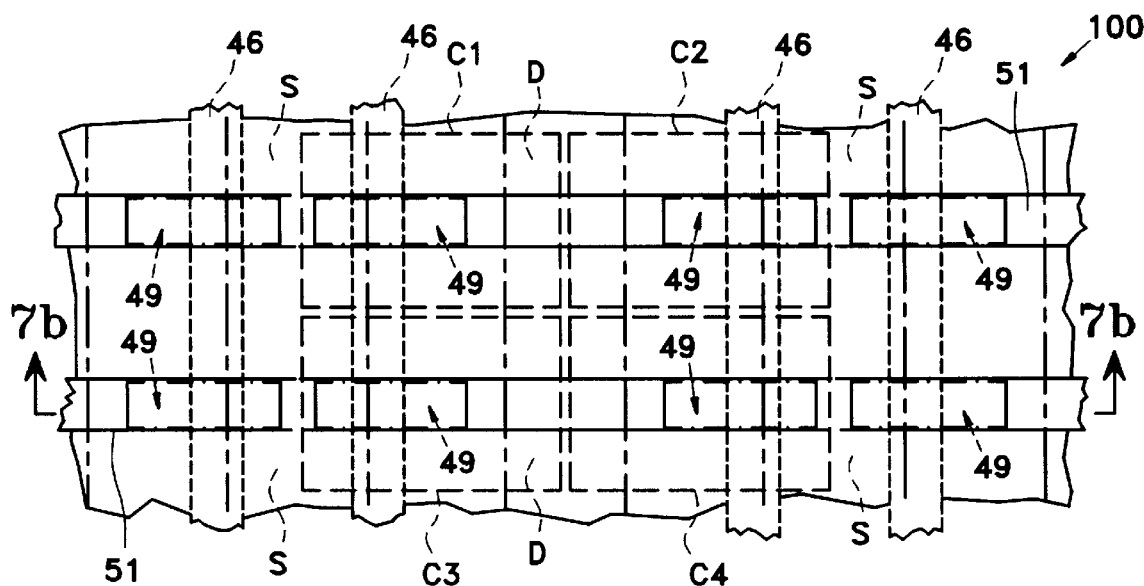
FIG. 7a is a top plan view of the memory cell shown in FIG. 4a arranged in a partial matrix.
Figure 7B:
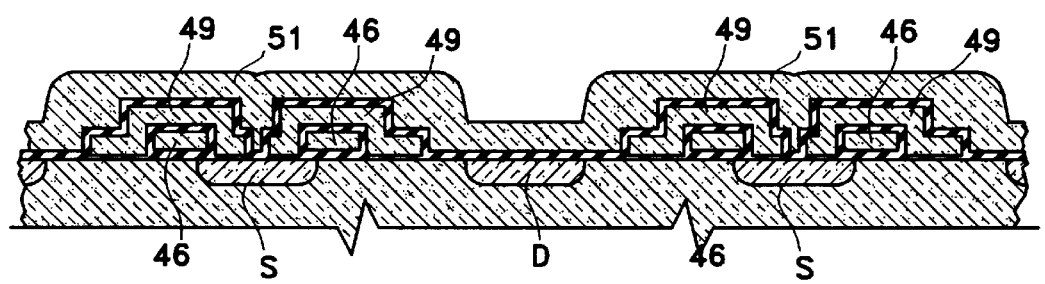
Figure 7C:
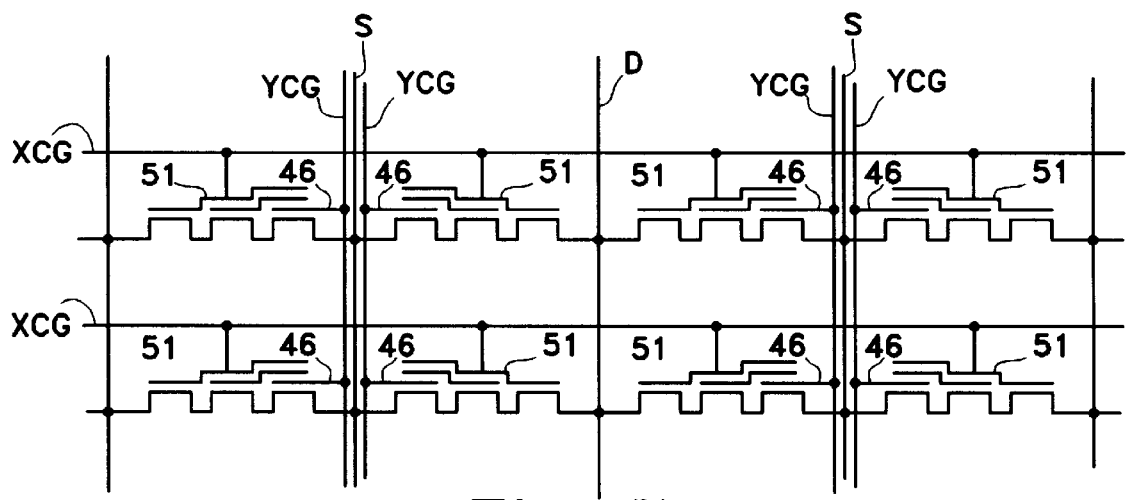

FIG. 7a is a top plan view of one example of a cell arrangement 100 in a matrix format made up of four cells, C1, C2, C3, and C4. Each of the 4 cells substantially comprises the same structure of the memory cell 13 shown in FIGS. 4a–4c. FIG. 7b is the cross-sectional view of the array 100 taken along line 7b—7b of FIG. 7a. FIG. 7c is a schematic representation of the array 100 shown in FIG. 7a.

Figure 8A:
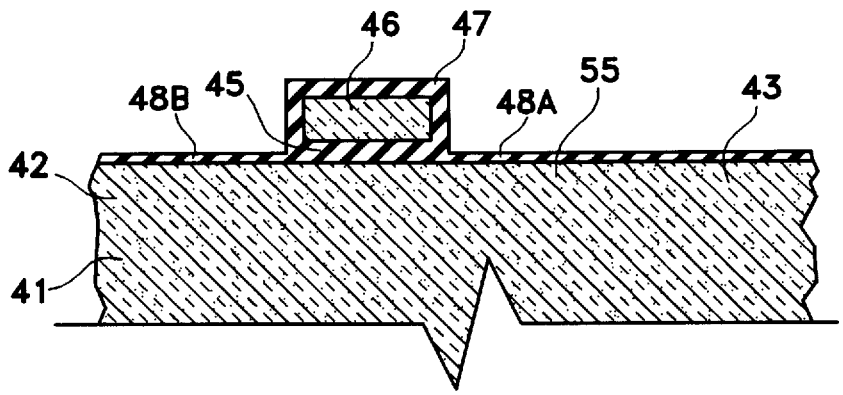
FIGS. 8a–8c are sequential drawings showing the fabrication process of the memory cell shown in FIGS. 4a–4c.
Figure 8B:
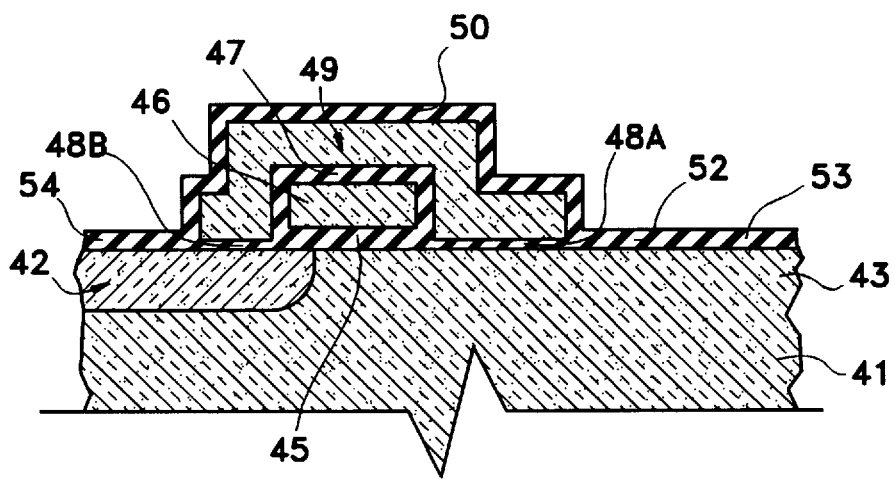
Figure 8C:
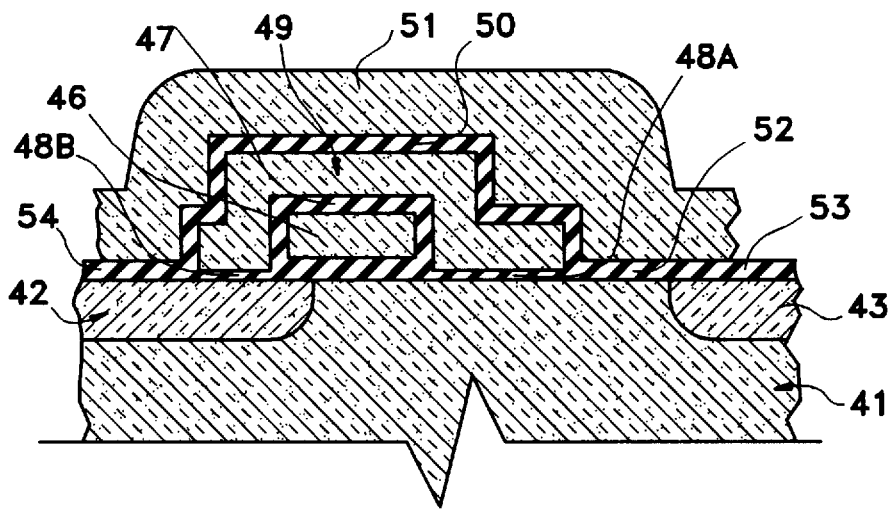

FIGS. 8a–8c are sequential drawings illustrating the fabrication process of memory cell 13. Processing steps relating to the making of a basic transistor are well known and are not described in detail here. To begin with, after the oxidation of a P-type silicon substrate 41, insulating film 45 of thickness approximately equals to 40 nanometers is available on the surface of semiconductor substrate 41. A polysilicon layer of approximately 450 nanometers is then deposited on the semiconductor substrate and then doped to a resistance of 6 Ohms. Conventional photomasking and etching steps are applied to define the Y-control gate 46. Afterwards, oxide layer 47 is grown on control gate 46 and etched away to a desired pattern. Another oxidation step is performed to define thin tunnel oxides 48A and 48B. The thickness of tunnel films 48A and 48B can be grown to approximately 10 nanometers. FIG. 8a shows the resultant structure up to this step. A second polysilicon layer of approximately 250 nanometers in thickness is then deposited on semiconductor substrate 41 and further doped to a resistance of about 6 Ohms. Conventional photomasking and etchings steps are again employed to define a proper pattern of the second polysilicon for the preparation of the ion implantation step for the source 42. After the ion implantation of source 42, conventional masking and etching steps are again performed to define the desired pattern for the floating gate 49. A thermal cycle is then conducted which oxidizes the second polysilicon layer and accumulates insulating films 50, 52, 53, and 54. At the same time, the implanted ions in the source region 42 is driven in and migrated laterally to underlie part of floating gate 49 and Y-control trace 46. The resultant structure is shown in FIG. 8b up to this point. What follows is another step of ion implantation to define the drain 43. A third polysilicon layer of approximately 450 nanometers is then deposited and doped. After the masking and etching steps to a desired pattern, X-control gate 51 is defined. FIG. 8c shows the resultant structure up to this point. Isolations between adjacent cells can be accomplished by implanting the substrate with $P^+$-type material in isolation regions 55, such as boron as is shown in FIG. 4c.

It here should be noted that instead of polysilicon, X-control gate 51, Y-control gate 46, and floating gate 49 can be substituted with other materials. Examples are tungsten silicide or titanium silicide.

Figure 9A:
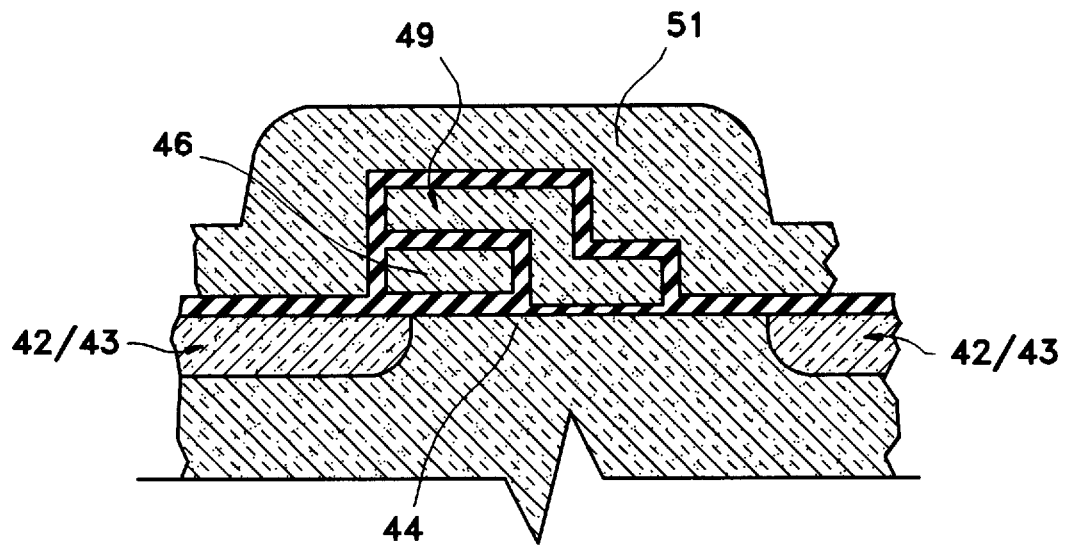
FIG. 9a shows a second embodiment of the memory cell in accordance with the present invention.
Figure 9B:
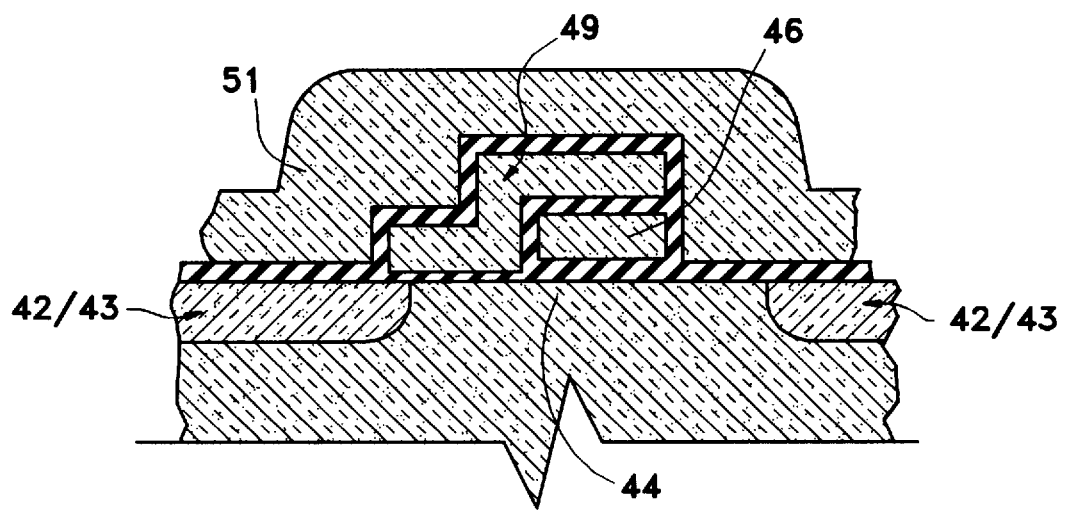
FIG. 9b shows a third embodiment of the memory cell in accordance with the present invention.
Figure 10A:
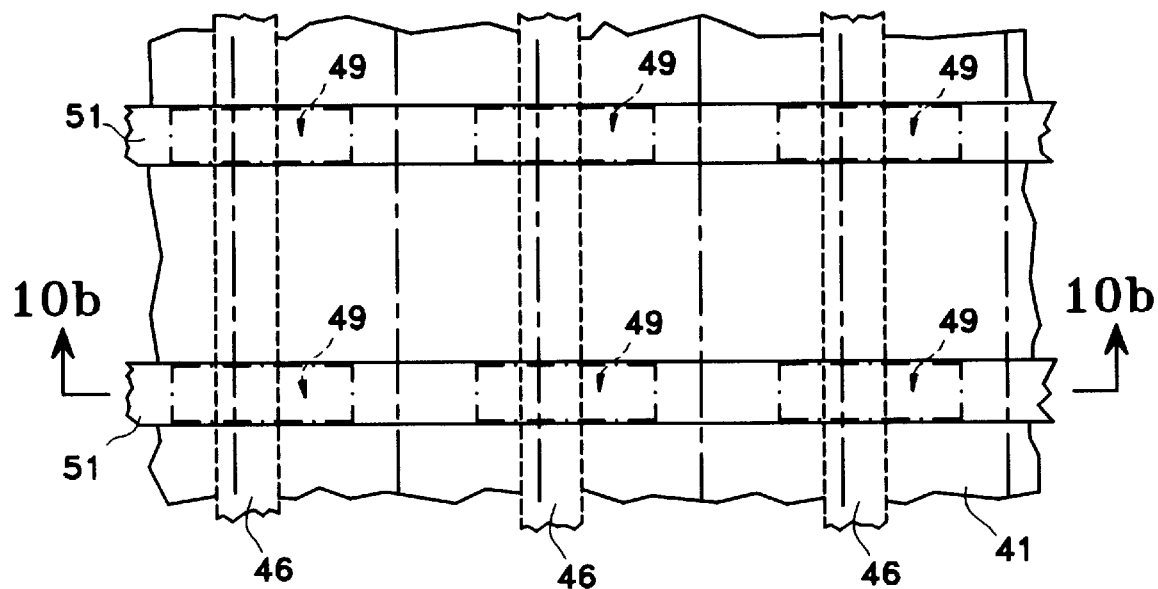
FIG. 10a shows a different cell arrangement of the memory cells shown in FIGS. 4a–4c.
Figure 10B:
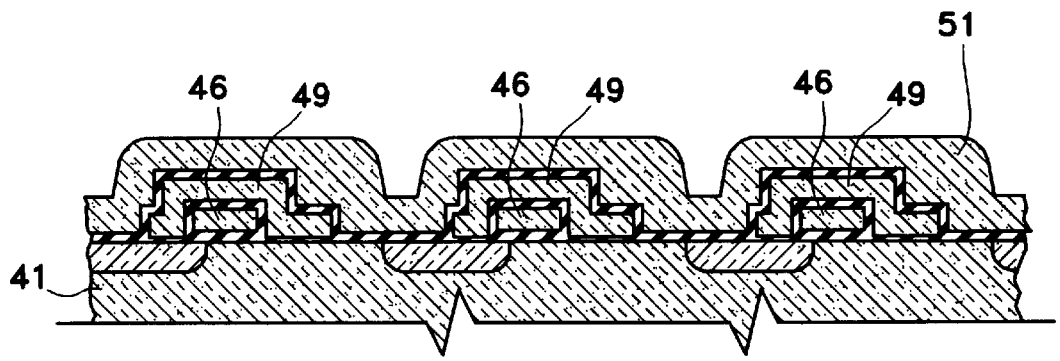

With the preferred embodiment of the present invention illustrated, the above description is not to be construed in a limiting sense. Various modifications of the preferred embodiment as well as other embodiments of the present invention will be apparent to persons skilled in the art. For examples, field oxide can be used as a replacement for cell isolations 55. Oxide-nitride-oxide insulating films can be used to substitute oxide insulating films 47 and 50. The thin tunnel film 48A can be replaced by gate oxides. Materials, shapes, and arrangements for the X-control gate 51, floating gate 49, Y-control gate 46, insulating films 45, 47, 52 and 53 can assume various forms and variations. FIG. 9a and FIG. 9b show two exemplary variations to the preferred embodiment as was described. These embodiments may be operated under different voltages levels for programming and de-programming. In FIG. 9a the floating gate 49 is arranged without dielectrically overlapping the source 42. In FIG. 9b, the Y-control gate 46 is arranged to control the middle portion of the channel. Also, source 42 and drain 43 are designed to be interchangeable. For this reason, the both regions are labeled as 42/43. FIG. 10a shows a different arrangement of the array in comparison with the array shown in FIG. 7a. FIG. 10b is a cross-sectional view taken along line 10b—10b of FIG. 10a. The array shown in FIGS. 10a–10b are fully functional and operational. These are some of the exemplary modifications that fall within the scope of the present invention.

What is claimed is:

1. A non-volatile semiconductor memory cell comprising:

a semiconductor substrate;

a source formed in said semiconductor substrate;

a drain formed in said semiconductor substrate spaced from said source;

a channel having a conductivity disposed between said drain and said source;

a first control trace dielectrically disposed atop said channel;

a second control trace dielectrically disposed atop said first control trace and at least a portion of said channel;

a floating gate dielectrically disposed between said first and second control traces;

wherein when said first and second control traces are substantially simultaneously energized to a first set of potential values, electrical charges are couplingly induced in said floating gate from said substrate, allowing said floating gate to couplingly vary the conductivity of said channel after de-energization of said control traces, and wherein when said first and second control traces are substantially simultaneously energized to a second set of potential values, electrical charges are couplingly induced out of said floating gate to said substrate, allowing said floating gate to couplingly vary the conductivity of said channel after de-energization of said control traces.

2. The non-volatile memory cell as set forth in claim 1 wherein said first and second control traces being elongated in shape and are dielectrically disposed atop said semiconductor substrate substantially perpendicular to each other.

3. The non-volatile memory cell as set forth in claim 1 wherein said floating gate further comprising a first and a second segment, wherein said first segment being dielectrically disposed between said first and second control traces, and wherein said second segment being dielectrically disposed atop at least another portion of said channel.

4. The non-volatile memory cell as set forth in claim 3 wherein said floating gate further comprising a third segment dielectrically disposed atop at least a portion of said source.

5. The non-volatile memory cell as set forth in claim 4 wherein when said first and second control traces are energized to said first set of potential values, electrical charges are couplingly induced in said floating gate from said channel by source side injection effect, and wherein when said first and second control traces are energized to said second set of potential values, electrical charges are couplingly induced out of said floating gate to said source by Fowler-Nordheim effect.

6. A memory cell array formed in a semiconductor substrate including a plurality of non-volatile memory cells, each of said non-volatile memory cell comprising:

a source formed in said semiconductor substrate;

a drain formed in said semiconductor substrate spaced from said source;

a channel including a first portion, a second portion, and a third portion therein disposed between said source and said drain;

a first control trace dielectrically disposed atop said third portion of said channel and at least a portion of said source;

a second control trace dielectrically disposed atop said first control trace and substantially perpendicular therewith, said second control trace having a portion thereof dielectricaly disposed atop said first portion of said channel;

a floating gate having a first segment thereof dielectrically disposed between said first control and said second control traces, and a second segment thereof dielectrically disposed atop said second portion of said channel;

wherein said plurality of non-volatile memory cells being disposed in the semiconductor substrate in a matrix of rows and columns with each of said second control traces in each of said rows of said matrix being electrically connected together, and with each of said first control traces in each of said columns of said matrix being electrically connected together, thereby allowing each of said non-volatile memory cells to be selectively programmed when the selected first and second control traces are substantially simultaneously energized to a first set of potential values, and thereby allowing each of said non-volatile memory cells to be selectively deprogrammed when the selected first and second control traces are substantially simultaneously energized to a second set of potential values.

7. A non-volatile semiconductor memory cell comprising:

a semiconductor substrate;

a source having a first portion and a second portion therein formed in said semiconductor substrate;

a drain formed in said semiconductor substrate spaced from said source;

a channel including a first portion, a second portion, and a third portion therein disposed between said drain and said source, said channel having a conductivity;

an elongated Y-control trace dielectrically disposed atop said third portion of said channel and said first portion of said source;

an elongated X-control trace dielectrically disposed atop said Y-control trace and substantially perpendicular therewith; said X-control trace having a portion thereof dielectricaly disposed atop said first portion of said channel; and a floating gate having a first segment thereof dielectrically disposed between said X-control and Y-control traces, a second segment thereof dielectrically disposed atop said second portion of said channel, and a third portion thereof dielectrically disposed atop said second portion of said source;

wherein when said X-control and Y-control traces are substantially simultaneously positively energized, electrical charges are couplingly induced in said floating gate from said channel by source side injection effect allowing said floating gate to couplingly vary the conductivity of said channel after de-energization of said control traces, thereby enabling the non-volatile memory cell to be programmable, and wherein when said X-control and Y-control traces are substantially simultaneously negatively energized, electrical charges are couplingly induced out of said floating gate to said source by Fowler-Nordheim tunneling effect allowing said floating gate to couplingly vary the conductivity of said channel after de-energization of said control traces, thereby enabling the non-volatile memory cell to be deprogrammable.

8. The non-volatile memory cell as set forth in claim 7 wherein said X-control trace, said Y-control trace, and said floating gate comprise conductive materials.

9. The non-volatile memory cell as set forth in claim 7 further comprising a thin tunnel film disposed between said third segment of said floating gate and said first portion of said source, such that electrical charges induced out of said floating gate to said source through said thin tunnel film by the Fowler-Nordheim effect.

10. A non-volatile semiconductor memory cell formed in a semiconductor substrate comprising:

a source having a first portion and a second portion therein formed in the semiconductor substrate;

a drain formed in the semiconductor substrate spaced from said source;

a channel including a first portion, a second portion, and a third portion therein disposed between said source and said drain;

a first elongated trace dielectrically disposed atop said third portion of said channel and said first portion of said source;

a second elongated trace dielectrically disposed atop said first elongated trace and substantially perpendicular therewith; said second elongated trace having a portion thereof dielectricaly disposed atop said first portion of said channel;

a floating gate having a first segment thereof dielectrically disposed between said first and second elongated traces, a second segment thereof dielectrically disposed atop said second portion of said channel, and a third portion thereof dielectrically disposed atop said second portion of said source;

wherein when said first and second control traces are energized to a first set of potential values, electrical charges are couplingly induced in said floating gate from said channel allowing said floating gate to couplingly vary the conductivity of said channel after de-energization of said control traces, thereby enabling the non-volatile memory cell to be programmable, and wherein when said first and second control traces are energized to a second set of potential values, electrical charges are couplingly induced out of said floating gate to said source allowing said floating gate to couplingly vary the conductivity of said channel after de-energization of said control traces, thereby enabling the non-volatile memory cell to be deprogrammable.

11. The non-volatile memory cell as set forth in claim 10 wherein said first control trace, said second trace, and said floating gate comprise polysilicon.

12. The non-volatile memory cell as set forth in claim 10 wherein when said first and second control traces are energized to said first set of potential values, electrical charges are couplingly induced in said floating gate from said second portion of said channel by source side injection effect, and wherein when said first and second control traces are energized to said second set of potential values, electrical charges are couplingly induced out of said floating gate to said first portion of said channel by Fowler-Nordheim effect.

13. The non-volatile memory cell as set forth in claim 12 further comprising a thin tunnel film disposed between said second segment of said floating gate and said second portion of said channel, such that electrical charges induced into said floating gate from said channel through said thin tunnel film by the source side injection effect when said first and second traces are energized to said first set of potential values.

14. The non-volatile memory cell as set forth in claim 12 further comprising a thin tunnel film disposed between said third segment of said floating gate and said second portion of said source, such that electrical charges induced out of said floating gate to said source through said thin tunnel film by the Fowler-Nordheim tunneling effect when said first and second traces are energized to said second set of potential values.

* * * * *